(12) United States Patent
Ning et al.

(10) Patent No.: US 10,153,041 B2
(45) Date of Patent: Dec. 11, 2018

(54) DUAL INLINE MEMORY MODULE WITH TEMPERATURE-SENSING SCENARIO MODE

(71) Applicant: Corsair Memory Inc., Fremont, CA (US)

(72) Inventors: Shu-Liang Ning, Taipei (TW); Fu-Yun Cheng, Taipei (TW); Ting-Yi Chang, Taipei (TW)

(73) Assignee: Corsair Memory Inc., Fremont, CA (US)

( * ) Notice: Subject to any disclaimer, the term of this patent is extended or adjusted under 35 U.S.C. 154(b) by 417 days.

(21) Appl. No.: 15/169,354

(22) Filed: May 31, 2016

(65) Prior Publication Data

US 2017/0343198 A1   Nov. 30, 2017

(51) Int. Cl.
*G11C 14/00* (2006.01)
*G11C 5/04* (2006.01)
*G11C 7/04* (2006.01)
*G11C 11/406* (2006.01)

(52) U.S. Cl.
CPC ............ *G11C 14/0018* (2013.01); *G11C 5/04* (2013.01); *G11C 7/04* (2013.01); *G11C 11/40626* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,219,156 | B1* | 5/2007 | Brown | G06F 11/30 709/226 |
| 8,583,869 | B2* | 11/2013 | Hinkle | G06F 13/20 710/313 |
| 8,656,072 | B2* | 2/2014 | Hinkle | G06F 13/20 710/301 |
| 9,158,716 | B2* | 10/2015 | Hinkle | G06F 13/20 |
| 9,865,310 | B2* | 1/2018 | Cantle | G11C 5/04 |
| 2013/0138901 | A1* | 5/2013 | Cordero | G06F 11/1658 711/162 |

FOREIGN PATENT DOCUMENTS

TW    M448772 U1    3/2013

* cited by examiner

*Primary Examiner* — Travis R Hunnings (57) ABSTRACT

Disclosed is a dual inline memory module with temperature-sensing scenario modes. A plurality of volatile memory components and an EEPROM component are disposed on a module board. A plurality of LED components and a scenario-lighting controller are disposed at a radiant side of the module board. A light bar is located at the radiant side of the module board without direct installing relationship. A plurality of clamping-type heat spreaders are fastened to one another in a manner that the light bar is tightly clamped. Therein, the power of the scenario-lighting controller component is shared and linked with the power supply system of the LED components and the signals of the scenario-lighting controller component are shared and linked with the signal connection system of the EEPROM component. Accordingly, the lighting scenario performances controlled by the scenario-lighting controller accord with the sensing temperatures to adjust memory refreshing frequencies to avoid any incorrect performance caused by sensed temperature differences.

13 Claims, 7 Drawing Sheets

DUAL INLINE MEMORY MODULE WITH TEMPERATURE-SENSING SCENARIO MODE

FIELD OF THE INVENTION

The present invention relates to a memory module and more specifically to a dual inline memory module with temperature-sensing scenario modes.

BACKGROUND OF THE INVENTION

A conventional memory module comprises a module board and a plurality of volatile memory components surface-mounted on the module board for plugging the module into a memory socket of a computer system. As the working frequency of memory components becomes higher, memory modules have higher data transmission rates with larger power consumption. Therein, heat will accumulate in memory modules leading to system instability. When working temperatures of memory modules become higher and exceed the tolerance, the performance of memory modules significantly drops. At the same time, the Soft Error Rate (SER) of memory modules also significantly increases. Accordingly, the working temperatures of memory modules are expected to be accurately monitored and implemented.

It is an existing technology that LED components are disposed on a memory module. However, the known light emitting mechanism only roughly shows the difference between high temperature and normal temperature. It is difficult to achieve accurate programmable modulation of diversified temperature-sensing scenario modes. As disclosed in Taiwan utility Patent No. TW-M448772 entitled "Dynamic Random Access Memory", a conventional memory module comprises a module board, a plurality of LED components and a translucent light bar. The LED components are physically disposed on and electrically connected to the module board. The light bar is disposed on the module board with a direct connecting relationship to cover the LED components in a matter that light emitted from the LED components penetrates through the light bar. Therein, the disposition of the light bar is that a side of the memory module is directly clamped in a slot of the light bar. There is at least a recess formed on the sidewall of the slot of the light bar to accommodate LED components inside the slot of the light bar. Furthermore, a light-emitting controller for controlling the LED components is also disposed on the module board. Therein the light-emitting controller includes a temperature sensor to measure operating temperatures, to convert the measured temperature into a signal and to feedback to the light-emitting controller to modulate the emitting frequency of LED components according to the measured temperature. Through different light-emitting-frequency of the LED components, end users are reminded if the operation temperature of memory modules is overheated or not. The light-emitted control system of a conventional light-emitting memory module is an independent system with an independent temperature sensing system, an independent signal system and an independent power system. Thus, the manufacture cost of memory modules is greatly increased. Moreover, the new temperature sensing system to control light emitting frequency and the built-in temperature sensing system of memory modules to control refreshing frequency are two different systems. Therein, the sensing locations and the structures of the temperature sensors are different leading to different sensing temperatures. Furthermore, the light-emitting mode only roughly shows if memory modules are overheated or not without accurately correlate the working temperature of memory modules to the sensing temperature of the light-emitting system. Therein, it is very difficult to implement accurately adjusting temperature-sensing scenario modes according to operating temperatures.

SUMMARY OF THE INVENTION

The main purpose of the present invention is to provide a dual inline memory module with temperature-sensing scenario modes wherein the working temperature of the dual inline memory module may be accurately measured and implemented in a matter that the memory module correctly shows the predefined temperature-sensing scenario modes.

The second purpose of the present invention is to provide a dual inline memory module with temperature-sensing scenario modes wherein the signals of the scenario-lighting controller are shared and linked by a specific methodology to achieve lower manufacture cost.

The third purpose of the present invention is to provide a dual inline memory module with temperature-sensing scenario modes wherein a plurality of heat spreaders are fastened to one another in a matter that the light bar is clamped on the module board without direct installing relationship to achieve easy assembly of the light bar and to avoid damages to the LED components.

According to the present invention, a dual inline memory module with temperature-sensing scenario modes comprises a module board, a light bar and a plurality of clamping-type heat spreaders. Disposed on one board surface of the module board are a plurality of first volatile memory components and a plurality of second volatile memory components. Moreover, disposed between the first volatile memory components and the second volatile memory components is an Electrically-Erasable Programmable Read-Only Memory (EEPROM) component. The module board has a plugging side and a radiant side. Therein, a plurality of contact fingers are formed on the plugging side. Disposed on the radiant side are a plurality of Light Emitting Diode (LED) components and a scenario-lighting controller. The light bar is located on the radiant side of the module board without direct installing relationship. The clamping-type heat spreaders are tightly fastened to one another to enclose the board surface and an opposing surface of the module board to enhance easy fastening of the clamping-type heat spreaders in a matter that the light bar is tightly clamped. Therein, the power of the scenario-lighting controller is shared and linked with the power supply system of the LED components and the signals of the scenario-lighting controller are shared and linked with the signal connecting system of the EEPROM component.

Through the said technical means, the present invention provides a dual inline memory module focusing on the combination of the LED components and the EEPROM component for further in-depth implementation. The EEPROM component may have a built-in temperature sensor as same as the standard structure of a conventional non-radiant memory module. Therein, the working temperature of the memory module is monitored by the EEPROM component. The dual inline memory module further implements the signal converted from measured temperatures to a computer system through the signal bus connecting with the EEPROM component and the temperature signal transmitting fingers of the module board in a matter that an appropriate temperature-sensing scenario mode is chosen and feedback to the scenario-lighting controller. Therefore, the dual inline memory module drives the LED components to show various radiant colors, flashing frequencies, radiant intensity, etc. for appropriate scenarios. At the same time, the speed of the fan is adjusted accordingly. Thus, the end users may easily determine if the memory module is over heated or not which is very helpful to achieve a perfect balance between the system stability and the system performance of a computer system.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios may be selectively designed and disposed and the detail component layouts may be more complicated.

Figure 1:
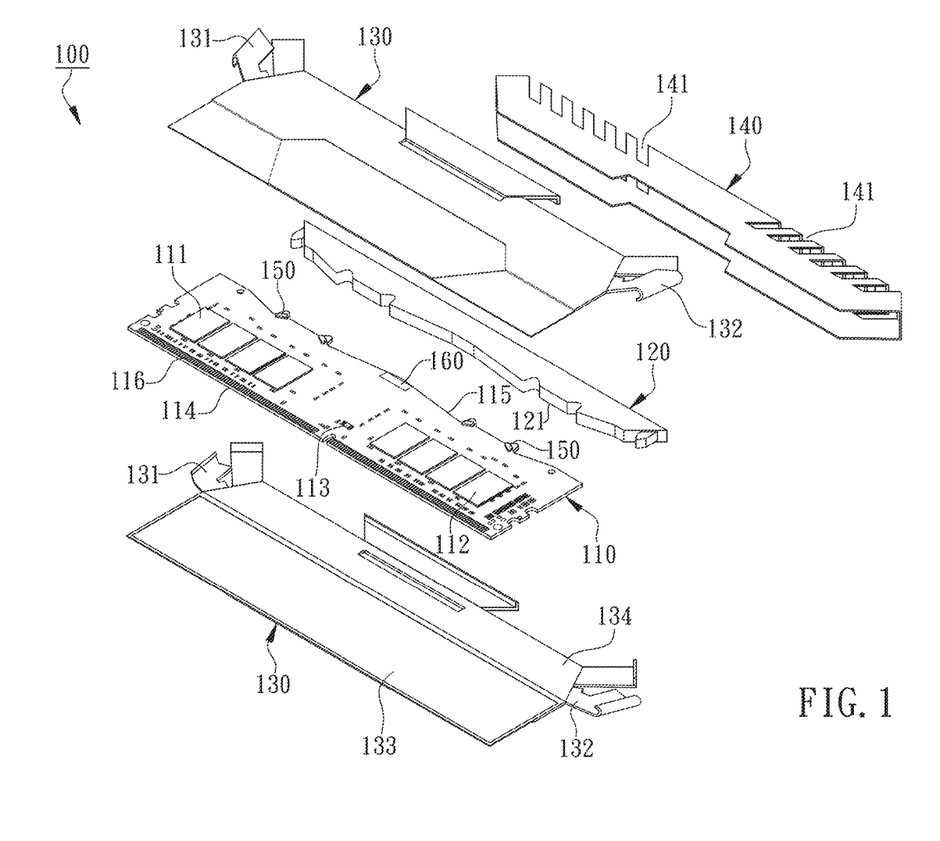
FIG. 1 is a three-dimensional perspective view of a dual inline memory module with temperature-sensing scenario modes according to the preferred embodiment of the present invention.

According to the preferred embodiment of the present invention, a dual inline memory module 100 with temperature-sensing scenario modes is disclosed and illustrated in FIG. 1 for a three-dimensional perspective top view. The dual inline memory module 100 comprises a module board 110, a light bar 120 and a plurality of clamping-type heat spreaders 130. Therein, a top view of the module board 110 of the dual inline memory module 100 is illustrated in FIG. 2 and a bus connection diagram of the module board 110 of the dual inline memory module 100 is illustrated in FIG. 3.

Figure 2:
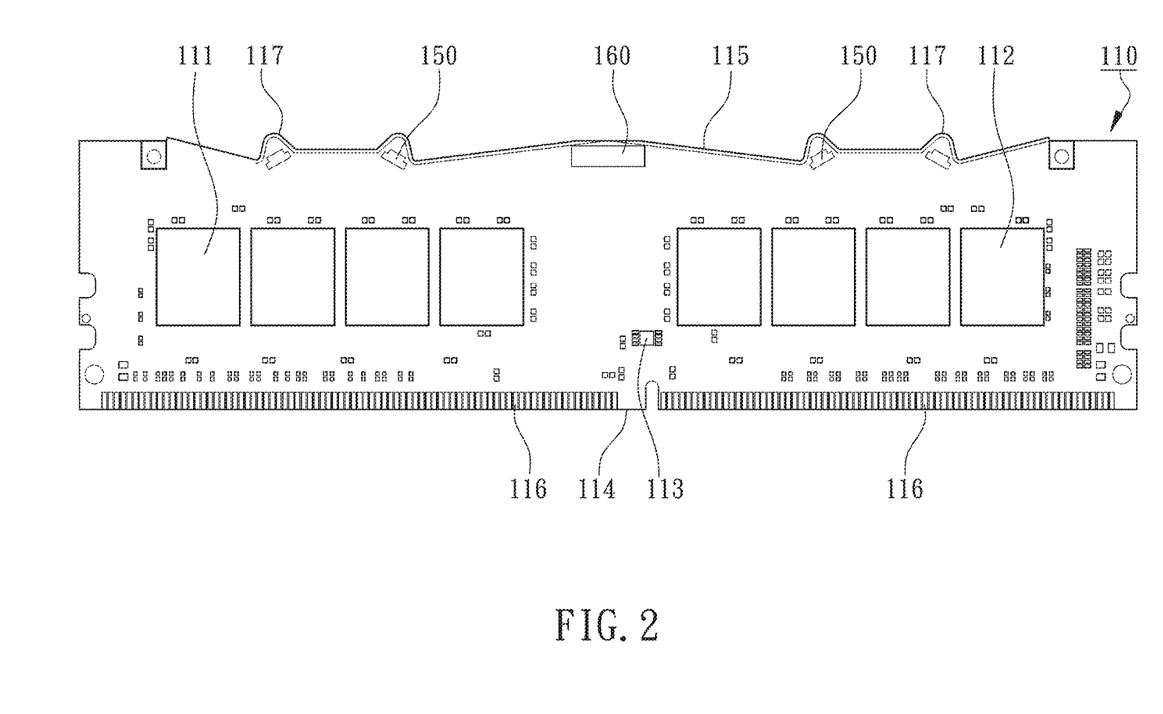
FIG. 2 is a top view of a module board of the dual inline memory module according to the preferred embodiment of the present invention.
Figure 3:
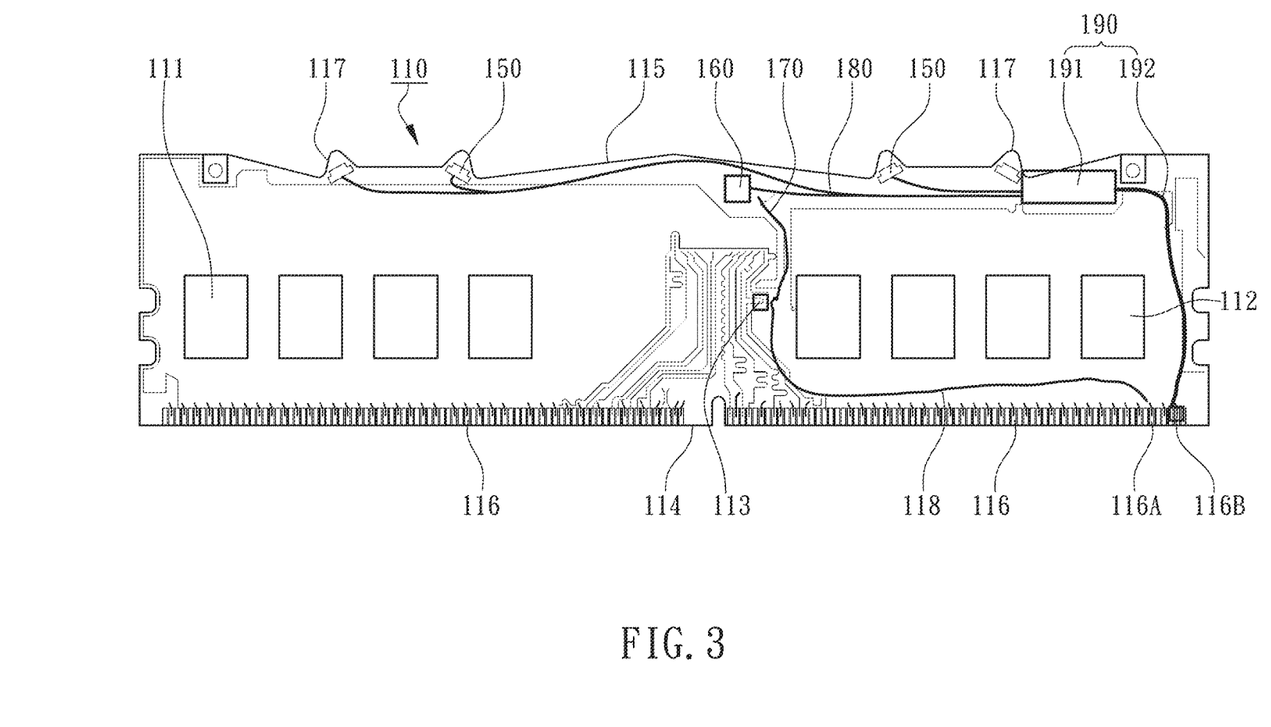
FIG. 3 is a bus connection diagram of the module board according to the preferred embodiment of the present invention.

As shown in FIG. 1 to FIG. 3, a plurality of first volatile memory components 111 and a plurality of second volatile memory components 112 are disposed on one board surface of the module board 110. The first volatile memory components 111 are disposed on one area of the board surface with constant spacing and the second volatile memory components 112 are disposed on another area of the board surface with constant spacing. The spacing between the first volatile memory components 111 and the second volatile memory components 112 is greater than the spacing among the first volatile memory components 111 and greater than the spacing among the second volatile memory components 112 in a matter that a large space is formed at the center of the board surface of the module board 110. The first volatile memory components 111 and the second volatile memory components 112 may specifically be Dynamic Random Access Memory (DRAM) such as DDR2 SDRAM, DDR3 SDRAM and DDR4 SDRAM. Moreover, an Electrically-Erasable Programmable Read-Only Memory (EEPROM) component 113 is disposed between those first volatile memory components 111 and those second volatile memory components 112. Therein, data in the EEPROM component 113 may be read, erased, and re-written for multiple times and data may be preserved without electricity like a hard drive. In the present embodiment, the EEPROM component 113 includes a built-in temperature sensor inside. Therein, the temperature measured by the built-in temperature sensor of the EEPROM component 113 for adjusting memory refreshing frequencies is transformed into signals to be implemented by a scenario-lighting controller 160 in a matter that the scenario-lighting controller 160 does not need a built-in temperature sensor.

The module board 110 has a plugging side 114 and a radiant side 115. The module board 110 further has a plurality of contact fingers 116 formed at the plugging side 114. A plurality of Light Emitting Diode (LED) components 150 and a scenario-lighting controller 160 are disposed at the radiant side 115. Therein, the scenario-lighting controller 160 is configured to control on-off, emitting colors, and flashing frequency of the LED components 150. A specific package type of the scenario-lighting controller 160 is a 20-pin Quad Flat No-Lead package (QFN 20). Referring to FIG. 1 to FIG. 3 again, preferably, the module board 110 further has a plurality of extruded portions 117 formed on the radiant side 150 with an irregular shape. Therein, the LED components 150 are mounted on the extruded portions 117 with a plurality of obliquely shining directions corresponding to the plugging side 114, wherein the obliquely shining directions are staggeringly arranged without shining in the same direction vertical to the plugging side 114. The light bar 120 has an irregular sidewall profile 121 matching to the radiant side 115 of the module board 110 in a matter that the light bar 120 shines uniformly.

Referring to FIG. 1, the light bar 120 is located on the radiant side 115 of the module board 110 without direct installing relationship. The material of the light bar 120 may be translucent plastic in a matter that the light emitting from the LED components 150 is guided into the light bar 120 to make light bar shine uniformly. Moreover, the clamping-type heat spreaders 130 are tightly fastened to one another to enclose one board surface and the opposing surface of the module board 110 in a matter that the light bar 120 is tightly clamped. In the present embodiment, each clamping-type heat spreader 130 has a fastening part 131 and the other fastening part 132 disposed at two opposing sides. The fastening parts 131, 132 of the clamping-type heat spreaders 130 fasten to one another become one body to tightly clamp the light bar 120. In a more specific embodiment, the dual inline memory module 100 further comprises a top cover 140 disposed on the light bar 120 without direct installing relationship. Therein, the top cover 140 is also tightly clamped by tightly fastening between the clamping-type heat spreaders 130. Accordingly, the top cover 140 may provide and enhance the consistency of metal appearance to ensure tightly clamping of the light bar 120. To be more specific, the top cover 140 has a plurality of hollow slots 141 in a matter that light emitting from the light bar 120 penetrates through the hollow slots 141.

Referring to FIG. 1 again, in a preferred and more specific embodiment, a heat dissipation layer 133 and a light reflection layer 134 are formed on each internal surface of the clamping-type heat spreaders 130. Therein, the heat dissipation layer 133 is attached to the first volatile memory components 111 and the second volatile memory components 112 for better heat dissipation. The light reflection layer 134 covers the LED components 150. Therefore, the light bar 120 does not need to cover the LED components 150 in a matter that the light emitting from the LED components 150 is efficiently guiding to the light bar 120.

Figure 4:
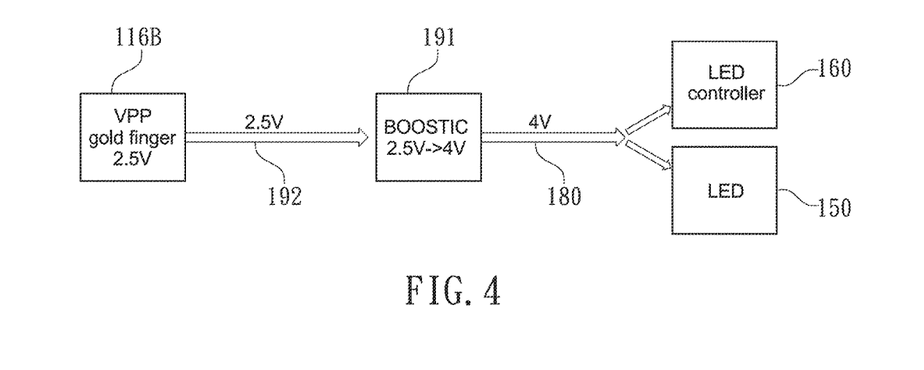
FIG. 4 is a connection diagram illustrating the power supply system of a plurality of LED components disposed on the module board according to the preferred embodiment of the present invention.
Figure 5:
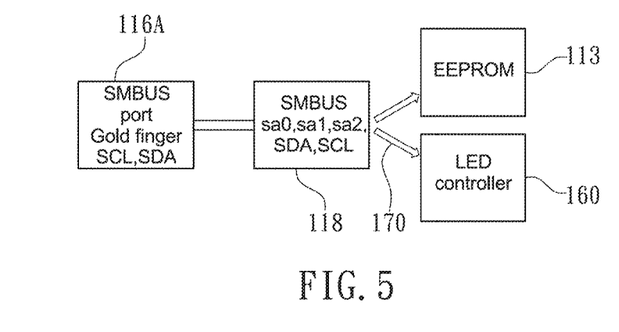
FIG. 5 is a connection diagram illustrating the signal connection system of an EEPROM component disposed on the module board according to the preferred embodiment of the present invention.
Figure 6:
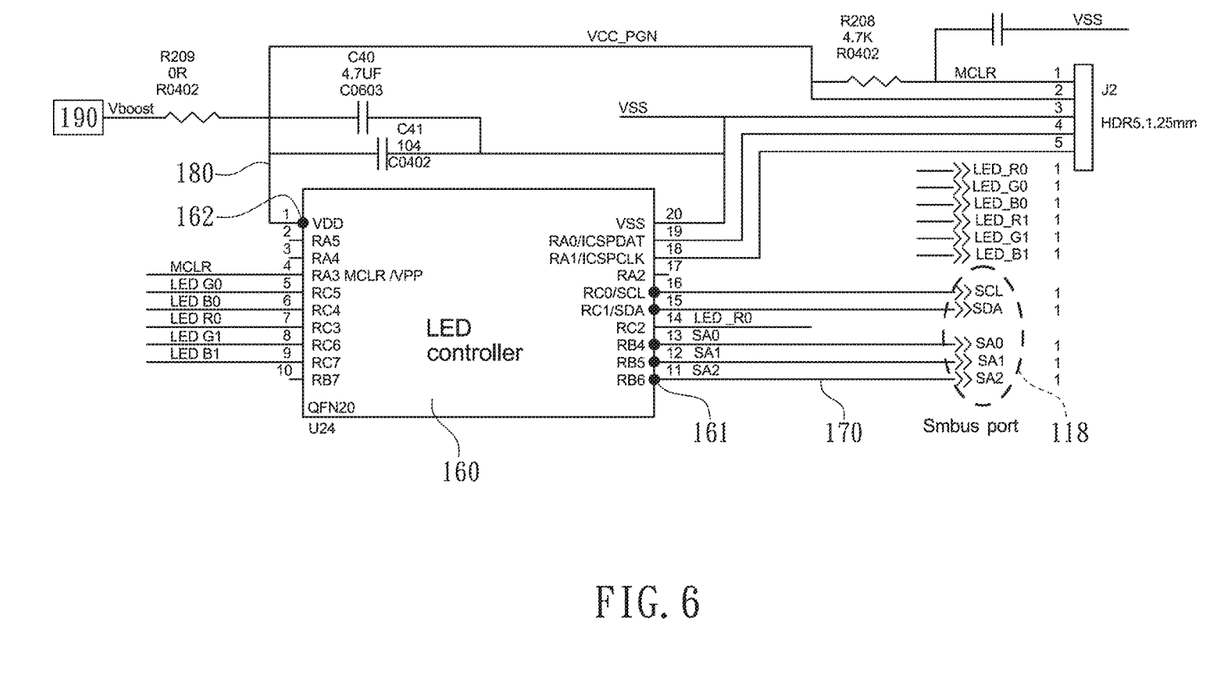
FIG. 6 is a circuit diagram of a scenario-lighting controller disposed on the module board according to the preferred embodiment of the present invention.
Figure 7:
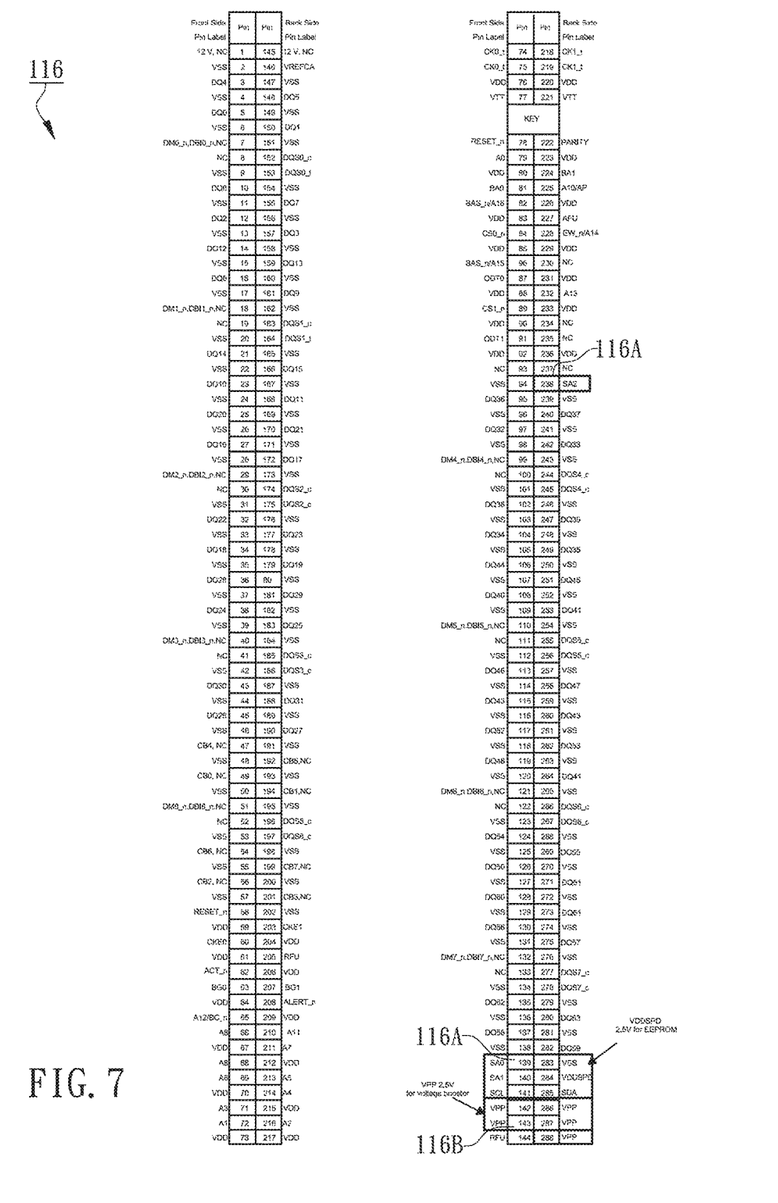
FIG. 7 is a pin assignment of a plurality of contact fingers of the module board according to the preferred embodiment of the present invention.
Figure 8:
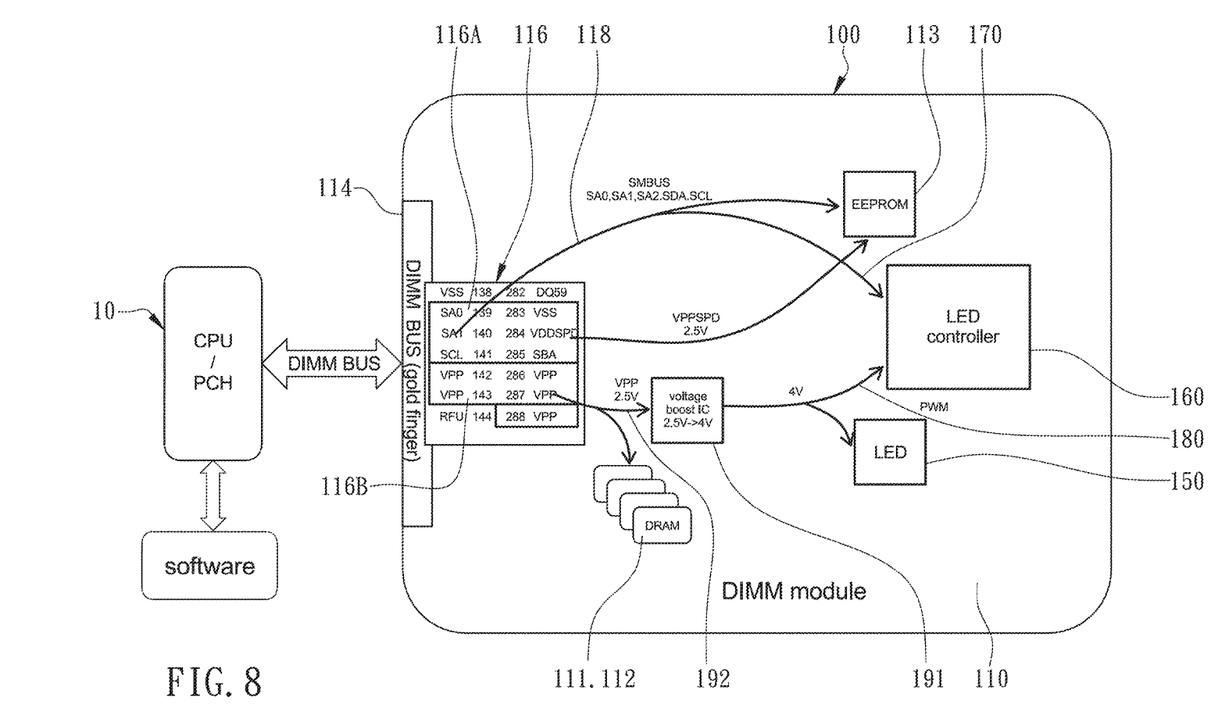
FIG. 8 is a connection diagram of the dual inline memory module to a computer device according to the preferred embodiment of the present invention.

Furthermore, the power of the scenario-lighting controller 160 is shared and linked with the power supply system 190 of the LED components 150. The signals of the scenario-lighting controller 160 are shared and linked with the signal connection system of the EEPROM component 113. A connection diagram of the power supply system of the LED components 150 disposed on the module board 110 is illustrated in FIG. 4. A connection diagram of the signal connection system of the EEPROM component 113 disposed on the module board 110 is illustrated in FIG. 5. A circuit diagram of the scenario-lighting controller 160 disposed on the module board 110 is illustrated in FIG. 6. A pin assignment of the contact fingers 116 of the module board 110 is illustrated in FIG. 7. A connection diagram of the dual inline memory module 100 to a computer device is illustrated in FIG. 8.

The signal connection system of the EEPROM component 113 includes a plurality of signal buses 118 connecting a plurality of first signal terminals of the EEPROM component 113 (the first signal terminals marked as SCL, SDA, SA0, SA1, SA2 as shown in FIG. 6) to a plurality of temperature signal transmitting fingers 116A of the contact fingers 116. Those signal buses 118 are specifically System Management Buses (SMBUS) of the memory module. As shown in FIG. 3, the module board 110 further has a plurality of sharing signal lines 170 and a plurality of sharing power lines 180. Therein, the sharing signal lines 170 connect the second signal terminals 161 of the scenario-lighting controller 160 (as shown in FIG. 6) to the signal buses 118. The sharing power lines 180 connect a plurality of power terminals 162 of the scenario-lighting controller 160 to the power supply system 190.

As shown in FIG. 3 to FIG. 8, the power supply system 190 provides power for the LED components 150 and includes a power bus 192 and a transformer 191 to convert a first working voltage to a second working voltage. Therein, the power bus 192 transmits the first working voltage from a plurality of power transmitting fingers 116B of the contact fingers 116 to the transformer 191. The sharing power lines 180 transmit the second working voltage from the transformer 191 to the scenario-lighting controller 160. Therein, the second working voltage is greater than the first working voltage. In the present embodiment, the first working voltage is 2.5 Volts and the second working voltage is 4 Volts.

Referring to FIG. 4, the power of the scenario-lighting controller 160 is shared and linked with the power supply system of the LED components 150 through the sharing power lines 180. Referring to FIG. 5, the signals of the scenario-lighting controller 160 are shared and linked with the signal connection system of the EEPROM component 113 through the sharing signal lines 170.

Referring to FIG. 6, the scenario-lighting controller 160 may not have a built-in temperature sensor with the corresponding circuitry. Referring to FIG. 7, the pin assignment of the contact fingers 116 of the module board 110 includes the corresponding temperature signal transmitting fingers 116A for the EEPROM component 113 and the corresponding power transmitting fingers 116B for the LED components 150. The terminals of the temperature signal transmitting fingers 116A are specifically marked as SCL, SDA, SA0, SA1, SA2 which are also connecting to the signal terminals of the scenario-lighting controller 160 as shown in FIG. 6. The terminals of the power transmitting fingers 116B are specifically marked as VPP which are connecting to the power supply system 190 of the LED components 150 as shown in FIG. 7.

Referring to FIG. 8, the dual inline memory module 100 is plugged into a computer device and connected to the computer processing device 10 such as Central Processing Unit (CPU) or Platform Controller Hub (PCH). The working temperature of the dual inline memory module 100 is accurately measured through the EEPROM component 113 and the temperature signals are transmitted to the computer processing device 10 through the signal connection system of the EEPROM component 113 for adjusting memory refreshing frequencies of the dual inline memory module 100. Therein, the pre-defined temperature-sensing scenario mode is matched and chosen through software programming. With correct address communication, the computer processing device 10 feedbacks the corresponding control signal to the scenario-lighting controller 160 through the signal connection system of the EEPROM component 113 (including the signal buses 118) and the sharing signal lines 170 in a matter that the LED components 150 may show the exact pre-defined temperature-sensing scenario modes.

The above description of embodiments of this invention is intended to be illustrative but not limited. Other embodiments of this invention may be obvious to those skilled in the art in view of the above disclosure which still may be covered by and within the scope of the present invention even with any modifications, equivalent variations and adaptations.

What is claimed is:
1. A dual inline memory module comprising:
  a module board including a plurality of first volatile memory components and a plurality of second volatile memory components disposed on one surface of the module board, the module board further including an Electrically-Erasable Programmable Read-Only Memory (EEPROM) component disposed between the first volatile memory components and the second volatile memory components, wherein the module board has a plugging side and a radiant side, wherein a plurality of contact fingers are formed at the plugging side, wherein a plurality of Light Emitting Diode (LED) components and a scenario-lighting controller are disposed at the radiant side;
  a light bar located on the radiant side of the module board without direct installing relationship; and a plurality of clamping-type hear spreaders fastened to one another to enclose the surface and the opposing surface of the module board in a matter that the light bar is tightly clamped.

2. The memory module as claimed in claim 1, wherein the power of the scenario-lighting controller is shared and linked with a power supply system of the LED components, and wherein the signals of the scenario-lighting controller is shared and linked with a signal connection system of the EEPROM component.

3. The memory module as claimed in claim 1, further comprising a top cover located on the light bar without direct installing relationship, the top cover is tightly clamped when the fastened-type heat spreaders are fastened to one another.

4. The memory module as claimed in claim 1, wherein the module board further has a plurality of extruded portions formed on the radiant side with an irregular shape, wherein the LED components are mounted on the extruded portions to have a plurality of obliquely shining directions corresponding to the plugging side, wherein the light bar has an irregular sidewall profile matching to the radiant side.

5. The memory module as claimed in claim 1, wherein a heat dissipation layer and a light reflection layer are formed on an internal surface of the clamping-type heat spreaders, wherein the heat dissipation layer is attached to the first volatile memory components and the second volatile memory components, wherein the light reflection layer covers the LED components.

6. The memory module as claimed in claim 1, wherein the EEPROM component includes a built-in temperature sensor inside.

7. The memory module as claimed in claim 2, wherein the signal connection system of the EEPROM component includes a plurality of signal buses connecting a plurality of first signal terminals of component to a plurality of temperature signal transmitting fingers of the contact fingers, wherein the module board further has a plurality of sharing signal lines and a plurality of sharing power lines, wherein the sharing signal lines connect a plurality of second signal terminals of the scenario-lighting controller to the signal buses, wherein the sharing power lines connect a plurality of power terminals of the scenario-lighting controller to the power supply system.

8. The memory module as claimed in claim 7, wherein the power supply system includes a power bus and a transformer to convert a first working voltage to a second working voltage, wherein the power bus transmits the first working voltage from a plurality of power transmitting fingers of the contact fingers to the transformer, wherein the sharing power lines transmit the second working voltage from the transformer, wherein the second working voltage is greater than the first working voltage.

9. A module board of a dual inline memory module comprising:
a plurality of first volatile memory components and a plurality of second volatile memory components disposed on one surface of the module board;
an Electrically-Erasable Programmable Read-Only Memory (EEPROM) component disposed between the first volatile memory components and the second volatile memory components, wherein the module board has a plugging side and a radiant side, wherein a plurality of contact fingers are formed at the plugging side; and
a plurality of Light Emitting Diode (LED) components and a scenario-lighting controller disposed at the radiant side;
wherein the power of the scenario-lighting controller is shared and linked with a power supply system of the LED components, and wherein the signals of the scenario-lighting controller is shared and linked with a signal connection system of the EEPROM component.

10. The module board as claimed in claim 9, wherein the module board further has a plurality of extruded portions formed on the radiant side with an irregular shape, wherein the LED components are mounted on the extruded portions to have a plurality of obliquely shining directions corresponding to the plugging side.

11. The module board as claimed in claim 9, wherein the EEPROM component includes a built-in temperature sensor inside.

12. The module board as claimed in claim 9, wherein the signal connection system of the EEPROM component includes a plurality of signal buses connecting a plurality of first signal terminals of the EEPROM component to a plurality of temperature signal transmitting fingers of the contact fingers, wherein the module board further has a plurality of sharing signal lines and a plurality of sharing power lines, wherein the sharing signal lines connect a plurality of second signal terminals of the scenario-lighting controller to the signal buses, wherein the sharing power lines connect a plurality of power terminals of the scenario-lighting controller to the power supply system.

13. The module board as claimed in claim 12, wherein the power supply system includes a power bus and a transformer to convert a first working voltage to a second working voltage, wherein the power bus transmits the first working voltage from a plurality of power transmitting fingers of the contact fingers to the transformer, wherein the sharing power lines transmit the second working voltage from the transformer, wherein the second working voltage is greater than the first working voltage.

* * * * *